US006989330B2

(12) United States Patent
Enomoto et al.

(10) Patent No.: US 6,989,330 B2
(45) Date of Patent: Jan. 24, 2006

(54) SEMICONDUCTOR DEVICE AND METHOD OF MANUFACTURE THEREOF

(75) Inventors: Yoshiyuki Enomoto, Kanagawa (JP); Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/756,012

(22) Filed: Jan. 13, 2004

(65) Prior Publication Data

US 2004/0140567 A1 Jul. 22, 2004

Related U.S. Application Data

(62) Division of application No. 10/182,661, filed as application No. PCT/JP01/10611 on Dec. 5, 2001, now Pat. No. 6,856,018.

(30) Foreign Application Priority Data

Dec. 8, 2000 (JP) ............................ 2000-373821

(51) Int. Cl.
*H01L 23/48* (2006.01)
*H01L 23/52* (2006.01)
*H01L 29/40* (2006.01)
*H01L 21/302* (2006.01)
*H01L 21/461* (2006.01)

(52) U.S. Cl. ...................... 438/689; 438/658; 438/688; 257/758; 257/773; 257/774

(58) Field of Classification Search ................ 257/758, 257/463, 764, 765, 770, 771, 773, 774; 438/684–690
See application file for complete search history.

(56) References Cited

U.S. PATENT DOCUMENTS

| | | | | |
|---|---|---|---|---|
| 5,614,439 | A | 3/1997 | Murooka et al. | |
| 5,644,166 | A * | 7/1997 | Honeycutt et al. | 257/754 |
| 5,700,383 | A * | 12/1997 | Feller et al. | 438/645 |
| 5,990,011 | A | 11/1999 | McTeer | |
| 6,150,272 | A * | 11/2000 | Liu et al. | 438/692 |
| 6,281,584 | B1 | 8/2001 | Ngo | |
| 2002/0109235 | A1 | 8/2002 | Leiphart | |

FOREIGN PATENT DOCUMENTS

| | | |
|---|---|---|
| JP | 10-098102 | 4/1998 |
| JP | 11-345876 | 12/1999 |
| JP | 2000-208622 | 7/2000 |
| JP | 2000-286262 | 10/2000 |
| JP | 2001-144180 | 7/2001 |
| JP | 2001-210647 | 8/2001 |
| JP | 2001-284448 | 10/2001 |

* cited by examiner

*Primary Examiner*—Jerome Jackson
*Assistant Examiner*—Jesse A. Fenty
(74) *Attorney, Agent, or Firm*—Sonnenschein, Nath & Rosenthal LLP

(57) ABSTRACT

In order to form an aluminum system wiring that does not peel off on an insulating film containing fluorine and to improve the reliability thereof, a semiconductor device according to the present invention includes an insulating film (14) containing fluorine formed on a substrate (11), a titanium aluminum alloy film **(17*a*) formed on the insulating film (14) containing fluorine, and a metallic film (17*b*) comprising aluminum or an aluminum alloy formed on the titanium aluminum alloy film (17*a*)**.

2 Claims, 5 Drawing Sheets

SEMICONDUCTOR DEVICE AND METHOD OF MANUFACTURE THEREOF

RELATED APPLICATION DATA

The present application claims priority to Japanese Application No. 2000-373821 filed Dec. 8, 2000 and PCT/JP01/10611 filed Dec. 5, 2001 and is a divisional of U.S. application Ser. No. 10/182,661 filed Jul. 31, 2002 now U.S. Pat. No. 6,856,016, all of which are incorporated herein by reference to the extent permitted by law.

FIELD OF THE INVENTION

The present invention relates to a semiconductor device and a method of manufacturing the same, and, in particular, it relates to a semiconductor device in which an improvement of adhesion between wiring and insulating film is attempted and a method of manufacturing the same.

BACKGROUND ART

Downsizing of wiring pitch has caused increase in wiring resistance and wiring capacitance. As a consequence, a problem of wiring delay has become significant. As a countermeasure thereto, low resistance wiring technology represented by copper wiring and the like, and low dielectric film represented by silicon oxide fluoride (the silicon oxide fluoride (SiOF) is referred to as FSG (Fluorine Silicate Glass) hereinafter), HSQ (Hydrogen Silsesquioxane) and the like, have been developed. In particular, FSG film is drawing attention in view of its compatibility with the conventional technology in view of its low dielectric property, which can be obtained by simply adding fluorine to a conventional silicon oxide film.

However, in the case in which the FSG film is used, there is a problem in which the wiring is peeled off during heat treatment thereof. This peeling is confirmed to occur in an interface between the wiring and insulating film containing fluorine after heat treatment. As an example thereof, a cross-section of a semiconductor device having its wiring formed in two layers is shown in FIG. 1.

As shown in FIG. 1, on a semiconductor substrate 111, a first insulating film 112 that does not contain fluorine is formed so as to cover a semiconductor element (for example, a transistor, DRAM or the like), which is not shown in the figure. A first wiring 113 is formed thereon including, from the bottom, a titanium (Ti) film, a titanium nitride (TiN) film, an aluminum copper (AlCu) film, a titanium (Ti) film and a titanium nitride (TiN) film. Then, a second insulating film 114 including a FSG film is formed in such a state to cover this first wiring 113. The second insulating film 114 including the FSG film is one that is formed by high density plasma CVD (CVD is an abbreviation of Chemical Vapor Deposition) method.

As a result, its film thickness differs depending on the width of the first wiring 113. In other words, the second insulating film 114 is formed thick on a first wiring 113*w* having broader width, and thin on a first wiring 113*s* having a narrower width.

On the second insulating film 114 including the above-mentioned FSG film is formed a third insulating film 115 with a silicon oxide film which is formed, for example, by the plasma CVD method, and the surface of the third insulating film 115 is flattened by a Chemical Mechanical Polishing (hereinafter, referred to as CMP). On this third insulating film 115 is formed a second wiring 117 having a likewise structure as that of the first wiring 113. Portions of the first wiring 113 and the second wiring 117 are connected via a tungsten plug 116. The semiconductor device 101 is thus constructed as described above.

However, when a sinter heat treatment is performed on the above-mentioned semiconductor device, for example, for one hour in a forming gas (nitrogen 96 vol. %, hydrogen 4 vol. %) atmosphere, for example, at 400° C., as shown in FIG. 2, a phenomenon that the second wiring 117 formed on the second insulating film 114 including the FSG is peeled is confirmed to occur. This phenomenon depends on its heat treatment period of time, and with an increasing heat treatment period of time, the peeling tends to worsen. This phenomenon as disclosed in Japanese Application Laid-Open No. Hei-8-321547 is estimated due to that free fluorine (F) in the FSG film is diffused externally during the heat treatment so as to react with titanium (Ti) which constitutes the bottom layer under the wiring and produce a titanium fluoride (TiF).

As a countermeasure, for example, as disclosed in the Japanese Application Laid-Open No. Hei.8-321547, there is a method for diffusing free fluorine present in the film to the external by applying annealing thereto after forming the FSG film. According to this method, because of an addition of the annealing process, if the process is increased, the electric resistance is increased due of application of heat to the wiring, thus generating the risk of deterioration of resistance properties against high temperature stress migration and the like. Further, as disclosed in Japanese Application Laid-Open No. Hei.10-326839, it is also considered to be an effective method for solving the above-mentioned problems to form an insulating cap film such as a $SiO_2$ film thereon after polishing the surface of the interlayer insulating film by CMP. However, this method involves also an addition of the step of forming the $SiO_2$ film.

DISCLOSURE OF THE INVENTION

The present invention relates to a semiconductor device and a method of manufacturing the same contemplated in order to solve the above-mentioned problems.

The semiconductor device of the present invention has an insulating film containing fluorine formed on a substrate, a titanium aluminum alloy film formed on the above-mentioned insulating film containing fluorine, and a metallic film including aluminum or an aluminum alloy formed on the above-mentioned titanium aluminum alloy film.

In the aforementioned semiconductor device, because the titanium aluminum alloy film is formed on the insulating film containing fluorine, and the metallic film including aluminum or the aluminum alloy is formed on this titanium aluminum alloy film, a reaction between free fluorine from the insulating film containing fluorine and titanium is suppressed, thereby securing adhesion between the wiring and the insulating film containing fluorine to be maintained. Therefore, it becomes possible to use the insulating film containing fluorine, which is a low dielectric film, as an interlayer insulating film, and to provide for a highly reliable wiring that does not peel off from the insulating film containing fluorine because the adhesion thereof with the metallic film serving as the wiring is secured to be maintained.

A method of manufacturing the semiconductor device according to the present invention includes: a step of forming an insulating film containing fluorine on a substrate; a step of forming a titanium film on the above-mentioned insulating film containing fluorine; and a step of forming a metallic film including aluminum or an aluminum alloy on the titanium film, wherein a subsequent step after said step of forming said metallic film inclusive thereof, in which said titanium film and said metallic film are to be heated, further includes a step of forming a titanium aluminum alloy film by causing a reaction between said titanium film and a part of aluminum of said metallic film.

In the above-mentioned method of manufacturing the semiconductor device, when forming the titanium film on the insulating film containing fluorine and further forming the metallic film, or in the subsequent step after forming the metallic film during which the titanium film and the metallic film are heated, because of the provision of the step of forming the titanium aluminum alloy film by causing to react the titanium film with the part of aluminum of the metallic film, the reaction between the free fluorine from the insulating film containing fluorine and titanium is suppressed by the titanium aluminum alloy film thus produced. In other words, before the free fluorine which is diffused from the insulating film containing fluorine during a long time heat treatment such as a sintering heat treatment or the like is allowed to react with titanium, the titanium is consumed as the titanium aluminum alloy film. Therefore, a production of a titanium fluoride (TiF) which causes to lower adhesion between the wiring and the insulating film containing fluorine can be suppressed. Thereby, it becomes possible to use the insulating film containing fluorine which is the low dielectric film as an interlayer insulating film, and because of its adhesion with the metallic film serving as the wiring being secured, it becomes possible to form a highly reliable wiring that does not peel off from the insulating film containing fluorine.

Further, because the titanium aluminum alloy film is formed in the subsequent steps including the step of forming the metallic film, in which the titanium film and the metallic film are heated, by causing to react the titanium film with part of aluminum of the metallic film, it becomes possible to form the same without increasing the number of steps in comparison with the conventional technology.

BEST MODES OF EMBODIMENT FOR IMPLEMENTING THE INVENTION

Figure 1:
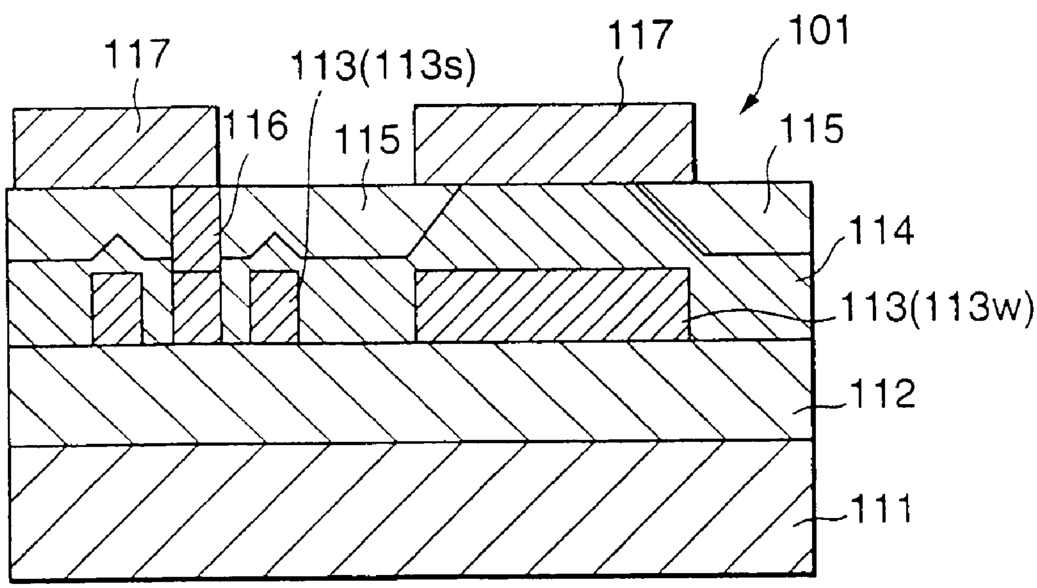
FIG. 1 is a schematic structural cross-section diagram showing an example of a method of manufacturing a semiconductor device according to a conventional technology.
Figure 2:
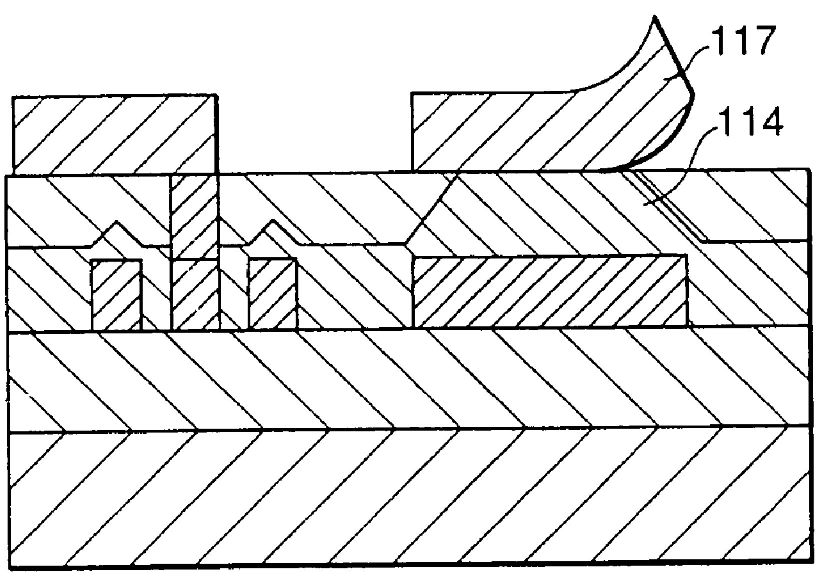
FIG. 2 is a schematic structural cross-section diagram showing a problem associated with the conventional technology.
Figure 3:
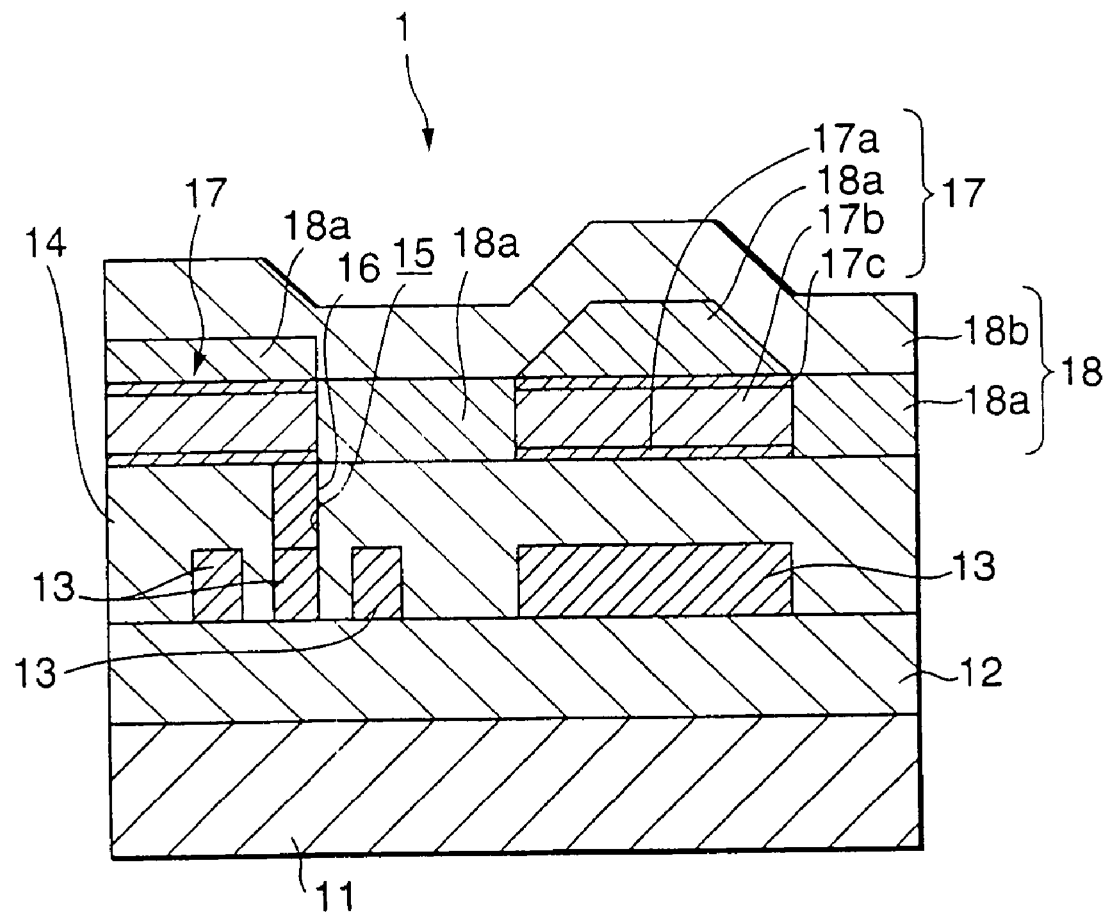
FIG. 3 is a schematic structural cross-section diagram showing an exemplary embodiment of a semiconductor device according to the present invention.

An exemplary embodiment for implementing the semiconductor device according to the invention is described by referring to the schematic structural cross-section diagram of FIG. 3.

As shown in FIG. 3, a first insulating film 12 including $SiO_2$ is formed on a semiconductor substrate 11 so as to cover a semiconductor element (for example, a transistor, DRAM or the like), which is not shown. On a part of this surface there is formed a first wiring 13. This first wiring 13 includes, for example, from the bottom layer, a titanium (Ti) film, a titanium nitride (TiN) film, an aluminum copper (AlCu) film, a titanium (Ti) film, and a titanium nitride (TiN) film. In such a state to cover this first wiring 13, for example, an FSG film as an insulating film (a second insulating film) 14 containing fluorine is formed, for example, by a high density plasma CVD method.

In the above-mentioned insulating film 14 containing fluorine there is formed a connection hole 15 reaching the first wiring 13, and inside the connection hole 15 there is formed a plug 16 connecting with the first wiring 13, for example, with tungsten, thereby leading an electrode out of the surface of the insulating film 14 containing fluoride. Further, on the insulating film 14 containing fluorine there is formed a second wiring 17, a part of which is connected with the above-mentioned plug 16.

The above-mentioned second wiring 17 has a lamination structure, from the bottom, of a titanium aluminum alloy film 17*a* and a metallic film 17*b* including aluminum, aluminum copper or the like, and if needed, for example, of a titanium nitride film formed as a reflection prevention film 17*c* on the above-mentioned lamination film as an upper layer.

The above-mentioned titanium aluminum alloy film 17*a* is formed to a film thickness, for example, of 5 nm or more and 70 nm or less, and preferably to a film thickness of 10 nm or more and 50 nm or less. It is to be noted that, if the film thickness of the titanium aluminum alloy film 17*a* is thinner than 5 nm there is feared to occur a drop in the electro-migration resistance of the wiring. Also, if the titanium aluminum alloy film 17*a* is thicker than 70 nm, there occurs an increase in the wiring resistance, and a wiring fabrication becomes difficult. Further, if required, a nitride oxide silicon film (not shown) can be also used as an inorganic reflection prevention film as an upper layer on the reflection prevention film 17*c*.

Further, on the insulating film 14 containing fluorine, a third insulating film 18 which covers the second wiring 17 is formed, for example, as a lamination film of a $SiO_2$ film 18*a* and a plasma silicon nitride (P—SiN) film 18*b*.

In the above-mentioned semiconductor device 1, because the titanium aluminum alloy film 17*a* is formed on the insulating film 14 containing fluorine, and on this titanium aluminum alloy film 17*a* there is formed the metallic film 17*b* including aluminum or an aluminum alloy, the reaction between the free fluorine from the insulating film 14 containing fluorine and titanium is suppressed, thereby securing adhesion between the insulating film 14 containing fluorine and the metallic film 17*b* which constitutes the main part of the second wiring 17. Therefore, it is enabled to use the insulating film 14 containing fluorine, which is a low dielectric film, as the interlayer insulating film, and because of the adhesion with the metallic film 17*b* which constitutes the second wiring 17 being secured, the second wiring 17 is ensured to become a highly reliable wiring that does not peel off from the insulating film 14 containing fluorine. It is to be noted that, in the embodiment described above, it was set forth that the first wiring 13 has, from the bottom layer, the titanium film, titanium nitride film, aluminum copper film, titanium film and titanium nitride film, however, as for the first wiring 13, there is no limitation with respect to its wiring construction, and it may be arranged likewise the second wiring 17 such as, from the bottom layer, a titanium aluminum alloy film, an aluminum copper film, a titanium film and a titanium nitride film.

Next, an exemplary embodiment of a method of manufacturing the semiconductor device according to the present invention will be described by referring to the schematic structural cross-section diagrams of FIGS. 4A–4E. In FIGS. 4A–4E, the same components as the structural components already described in the above-mentioned FIG. 3 are given the same numbers and signs.

Figure 4A:
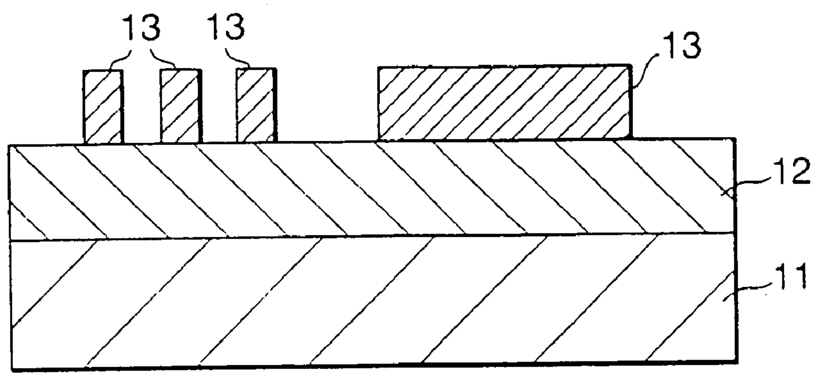
FIGS. 4A–4E are cross-sectional diagrams of manufacturing steps showing an exemplary embodiment of a method of manufacturing a semiconductor device according to the present invention.

As shown in FIG. 4A, on a semiconductor substrate (for example, a silicon substrate) 11, a plasma silicon oxide (P—$SiO_2$) film is formed, for example, to a thickness of 1000 nm as the first insulating film 12. Then, a first wiring forming film including a metallic film, a metallic compound film and the like for constituting the first wiring is formed, for example, by sputtering. More specifically, as an example, there are formed, from the bottom layer, a titanium (Ti) film to a thickness of 50 nm, a titanium nitride (TiN) film to a thickness of 20 nm, an aluminum copper (AlCu) film to a thickness of 400 nm, a titanium (Ti) film to a thickness of 5 nm, and a titanium nitride (TiN) film to a thickness of 70 nm. Subsequently, after having formed a resist film (not shown) for patterning, the above-mentioned resist film is fabricated into a pattern for forming the first wiring by the lithography technology, then using this as a mask, the first wiring forming film is fabricated by a reactivity ion etching to form the first wiring 13. After then, the above-mentioned resist film is removed.

Figure 4B:
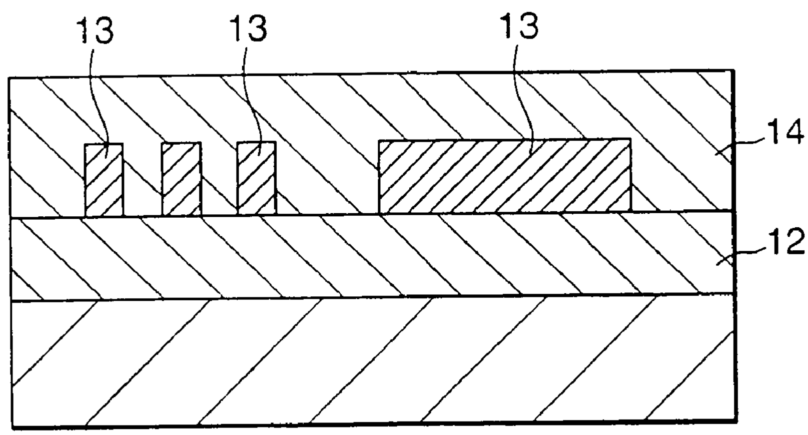

Subsequently, as shown in FIG. 4B, by the high density plasma CVD method, on the above-mentioned first insulating film 12, the FSG film as the insulating film (the second insulating film) 14 containing fluorine is formed such as to cover the above-mentioned first wiring 13, for example, to a thickness of 2.00 $\mu$m. This film forming condition, as one example, is such that an ICP (Inductively Coupled Plasma) CVD apparatus is used as a film forming apparatus, silane tetrafluoride ($SiF_4$) [a rate of flow: 40 $cm^3$/min], monosilane ($SiH_4$) [a rate of flow: 40 $cm^3$/min], and oxygen ($O_2$) [a rate of flow: 120 $cm^3$/min] are used as a source gas, argon (Ar) [a rate of flow: 65 $cm^3$/min] is used as a carrier gas, and that a pressure of film forming atmosphere is set at 0.53 Pa, an ICP power at 4.00 kW, and a bias power at 2.20 kW.

After having formed the above-mentioned insulating film 14 containing fluorine, by the chemical mechanical polishing (hereinafter referred to as CMP), a surface of the insulating film 14 containing fluorine is flattened.

Figure 4C:
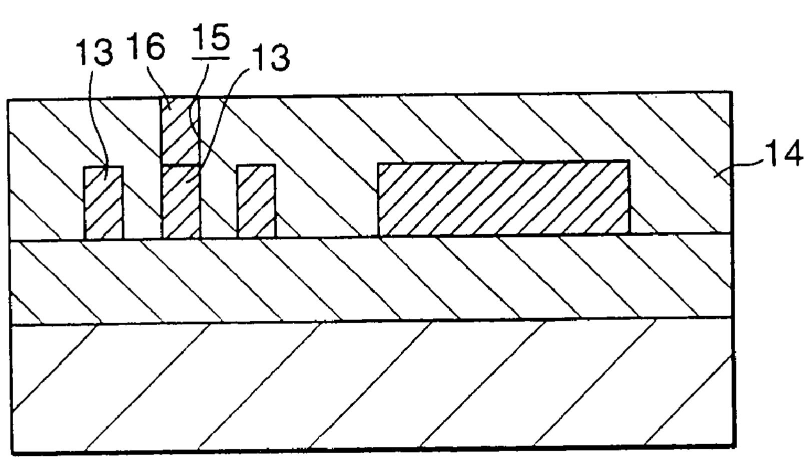

Then, as shown in FIG. 4C, after forming the resist film (not shown), the resist film is fabricated by the lithography technology, and by a reaction type ion etching using the resist film thus fabricated as a mask, a connection hole (bare hole) 15 is formed in the insulating film 14 containing fluorine for connecting between a part of the first wiring 13 and a second wiring (to be formed in a subsequent step).

Then, on the internal surface of the connection hole 15 and on the surface of the insulating film 14 containing fluorine, a titanium nitride film is formed to a thickness of 30 nm as an adhesive layer. Then, by the CVD method, a tungsten film is formed, for example, to a thickness of 400 nm for filling inside the connection hole 15. This tungsten film is also formed on the insulating film 14 containing fluorine via the adhesive layer.

After that, an excess tungsten film and adhesion layer on the insulating film 14 containing fluorine are removed by CMP, and a plug 16 including tungsten is formed inside the connecting hole 15 via the adhesion layer. Although CMP was used in the above-mentioned fabrication, it is also possible to remove the excess tungsten film and adhesion layer by use of etch-back.

Figure 4D:
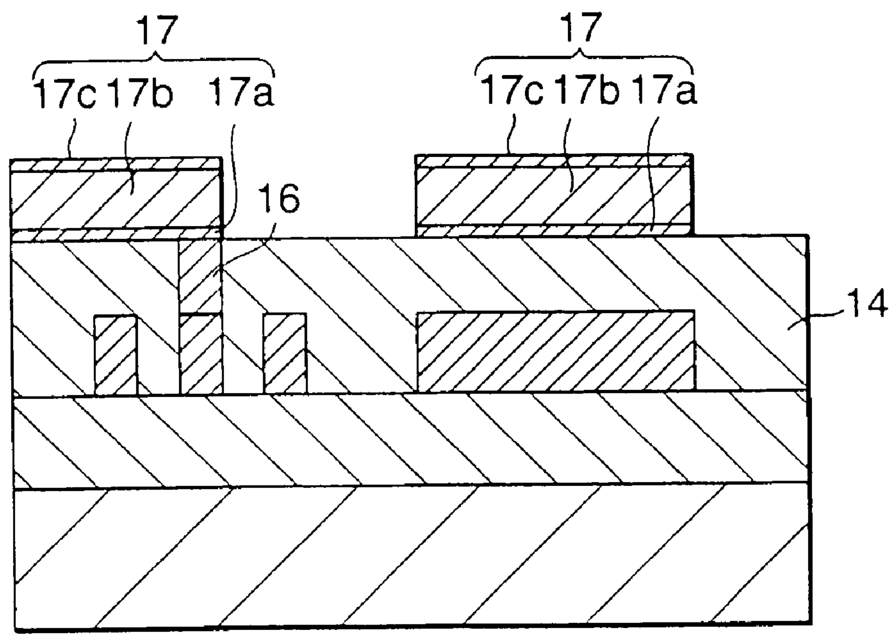

Next, as shown in FIG. 4D, on the insulating film 14 containing fluorine there is formed a second wiring 17. In order to form this second wiring 17, firstly, by sputtering, a titanium (Ti) film is formed, for example, to a thickness of 10 nm, then a metallic film 17*b* including aluminum copper (AlCu) is formed, for example, to a thickness of 400 nm. At this time, the above-mentioned titanium film and a part of aluminum in the metallic film 17*b* react to form a titanium aluminum alloy film 17*a*.

After forming the above-mentioned metallic film 17*b*, by forming, for example, a titanium nitride (TiN) film to a thickness of 25 nm a reaction prevention film 17*c* is formed, thereby providing the second wiring forming film. It is to be noted that, before forming the reflection prevention film 17*c* and after forming a titanium film (not shown), for example, to a thickness of 5 nm or so, the above-mentioned reflection prevention film 17*c* including the titanium nitride may be formed as well. In this case, in a subsequent process after having formed the titanium film, if a process is performed involving heating such as to cause a reaction between titanium and aluminum to produce a titanium aluminum alloy, the titanium film reacts with the metallic film to become the titanium aluminum alloy film.

Next, after forming a resist film (not shown), the resist film is fabricated by the lithography technology, then by the reaction type ion etching using this resist film thus fabricated as a mask, the second wiring forming film is fabricated to form the above-mentioned second wiring 17. A part of this second wiring 17 is connected to the above-mentioned plug 16.

Figure 4E:
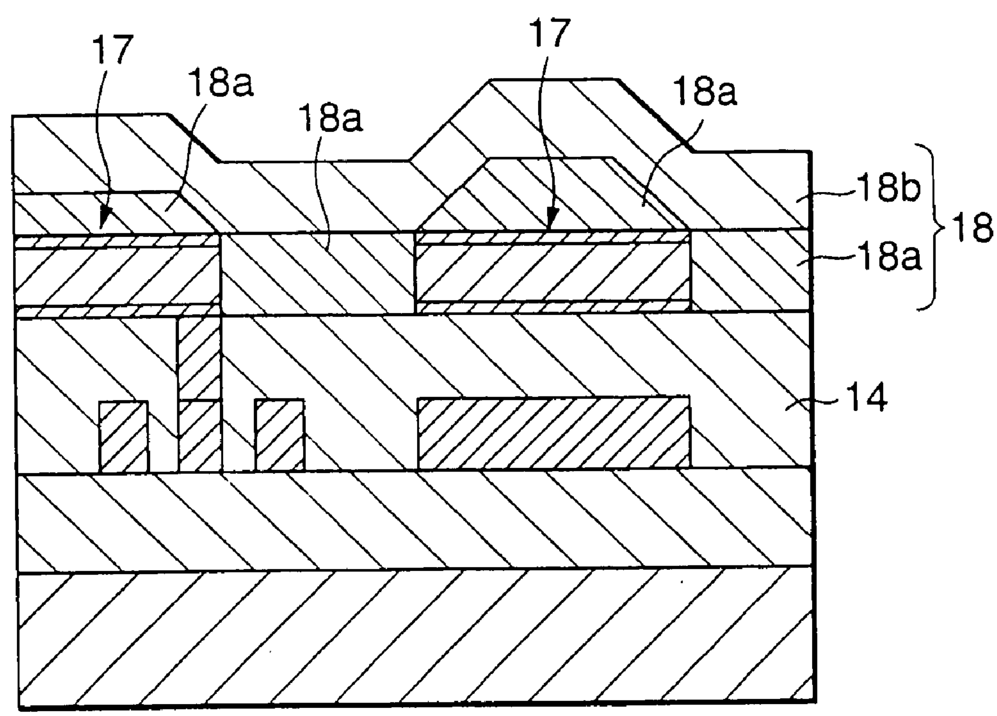

Then, as shown in FIG. 4E, on the insulating film 14 containing fluorine, a third insulating film 18 which covers the second wiring 17 is formed. This third insulating film 18 is formed, for example, by a lamination film of a $SiO_2$ film 18*a* and a plasma silicon nitride (P—SiN) film 18*b*. The above-mentioned $SiO_2$ film 18*a* is formed, for example, by the high density plasma CVD method, to a thickness, for example, of 500 nm, and the above-mentioned P—SiN film 18*b* is formed, for example, by the plasma CVD method, to a thickness, for example, of 500 nm.

After that, as a sinter heat treatment, in a forming gas (nitrogen: 96 vol. %, hydrogen: 4 vol. %) atmosphere, for example, at 400° C., the sinter heat treatment is carried out, for example, for one hour. Then, by the lithography technology and the reaction type ion etching technology, an opening (not shown) for a wire bonding connection is formed in the third insulating film 18.

In the method of manufacture described above, on the insulating film 14 containing fluorine, the titanium (Ti) film (not shown) is formed, and further the metallic film 17*b* including the aluminum copper (AlCu) is formed by sputtering. By the heat during this sputtering, titanium of the titanium film and aluminum of the metallic film 17*b* are reacted to produce the titanium aluminum (TiAl) alloy film 17*a*.

In the method of manufacture described above, although it is set forth that by the heat during the sputtering of the metallic film 17*b*, the titanium film is caused to react with aluminum of the metallic film 17*b* to produce the titanium aluminum alloy film, in the case if the titanium film is not sufficiently alloyed during this sputtering, in the subsequent process after the metallic film 17*b* having been formed and in which the titanium film and the metallic film 17*b* are heated, for example, such as when forming the third insulating film 18, by the heat of which, the alloying of the titanium aluminum alloy is further promoted thereby forming the titanium aluminum alloy film 17a.

As described hereinabove, in the method of manufacture according to the embodiment of the present invention, when forming the titanium film (not shown) on the insulating film 14 containing fluorine, and further forming metallic film 17b, or in the process after forming the metallic film 17b, which involves heating of the titanium film and the metallic film 17b, because of the provision of the process for producing the titanium aluminum alloy film 17a by reacting the titanium film with the part of aluminum in the metallic film 17b, the reaction between the free fluorine from the insulating film 14 containing fluorine and the titanium is suppressed by the titanium aluminum alloy film 17a, thereby ensuring adhesion between the insulating film 14 containing fluorine and the metallic film 17b to be maintained. Thereby, it becomes possible to use the insulating film 14 containing fluorine which is the low dielectric film as the interlayer insulating film, and in addition, because the adhesion with the metallic film 17a to serve as the wiring is secured, it becomes possible to form a highly reliable second wiring which does not peel off from the insulating film 14 containing fluorine.

Further, because the titanium aluminum alloy film 17a is formed in the subsequent processes including the process of forming the metallic film 17b, which involve heating of the titanium film and the metallic film thereby causing to react the titanium film with the part of aluminum in the metallic film, it is enabled to be formed without increasing the number of processes in comparison with the conventional technology.

As a result, the peeling phenomenon of the wiring as observed after the sinter heat treatment in the conventional wiring structure is suppressed. It is to be noted that, even if the sinter heat treatment is executed before forming the third insulating film 18, there occurs no peel off phenomenon to the second wiring 17.

Figure 5:
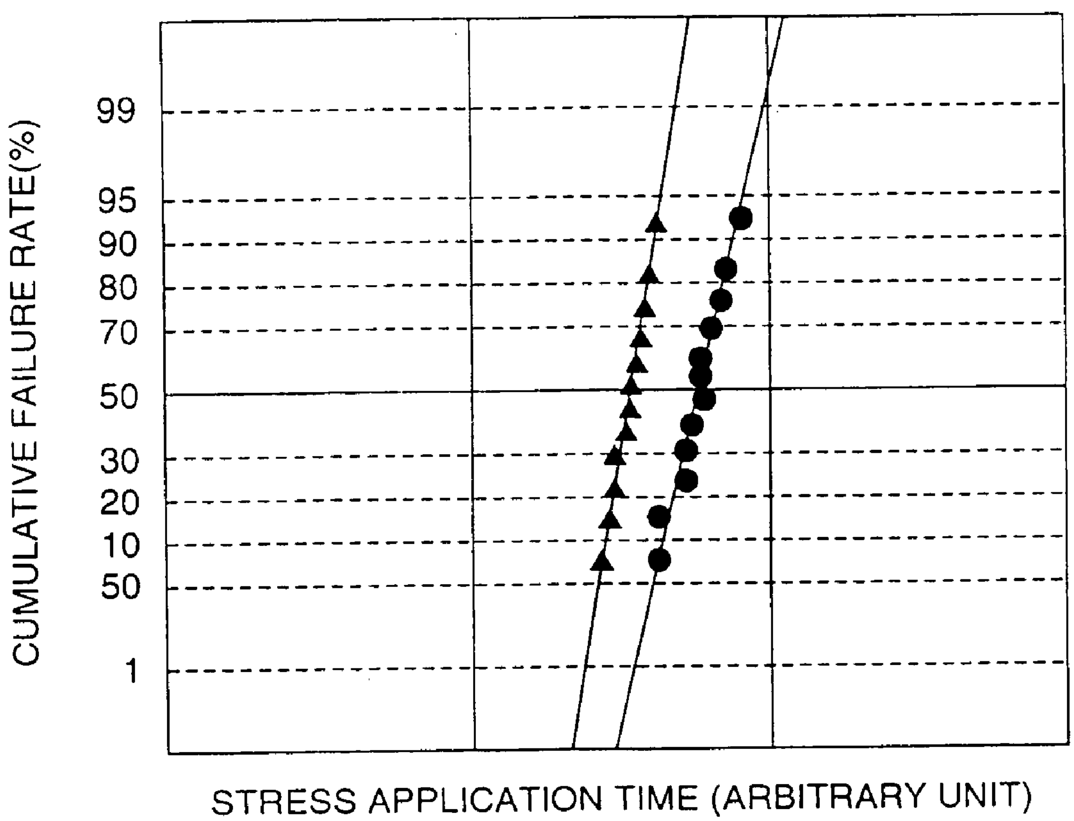
FIG. 5 is a diagram showing electro migration resistance of a wiring structure shown in the exemplary embodiment and of a conventional wiring structure as compared in terms of a cumulative failure rate.

Next, an electro-migration resistance of the wiring structure shown in the embodiment described above was investigated. A result thereof is shown in FIG. 5. In FIG. 5, on the abscissa is indicated a cumulative failure rate (%), and on the ordinate is indicated a stress application time (arbitrary period of time). Further, wiring structures in the case in which the titanium film was formed to a thickness of 10 nm, the aluminum copper film to a thickness of 400 nm, the titanium film to a thickness of 5 nm, and the titanium nitride film to a thickness of 70 nm, sequentially by the method of manufacture according to the embodiment of the invention are indicated by a circle mark, and wiring structures in the case in which, as described in Japanese Application Laid-Open No. Hei 10-326829 as the conventional art, the titanium film was formed to a thickness of 50 nm, the titanium nitride film to a thickness of 20 nm, the aluminum copper film to a thickness of 400 nm, the titanium film to a thickness of 5 nm, and the titanium nitride film to a thickness of 70 nm, sequentially, are indicated by a triangle mark.

As a result, as shown in FIG. 5, because the wiring structure implemented by the method of manufacture according to the embodiment of the invention has a longer stress application time than that of the wiring structure of the conventional technology, it is found to have a higher electro-migration resistance. As described above, the wiring structure implemented by the method of manufacture according to the embodiment of the invention is superior also in the electro-migration resistance.

Next, a status of occurrences of peeling of the wiring depending on a dielectric constant in the FSG film (a fluorine concentration estimated from the dielectric constant) and a thickness of the titanium film formed on the insulating film 14 containing fluorine was investigated. As an exemplary example, a wiring obtained by sequentially forming a titanium film to a thickness of 5 nm to 15 nm, an aluminum copper film to a thickness of 400 nm, a titanium film to a thickness of 5 nm, and a titanium nitride film to a thickness of 70 nm on the insulating film 14 containing fluorine by the method of manufacture according to the embodiment of the present invention described above was used. As an example of comparison, a wiring obtained by forming a titanium film to a thickness of 50 nm, a titanium nitride film to a thickness of 20 nm, an aluminum copper film to a thickness of 400 nm, a titanium film to a thickness of 5 nm, and a titanium nitride film to a thickness of 70 nm, sequentially on the insulating film 14 containing fluorine was used.

As a result, in the case in which a dielectric constant of the FSG film was 3.6 (6.8 atoms % estimated in terms of a fluorine concentration), and where the titanium film was 10 nm thick, the peeling of the wiring has not occurred. On the other hand, in the case of the comparison example, the peeling of the wiring did occur. Further, in the case in which the dielectric constant of the FSG film was 3.7 (5.3 atoms % estimated in terms of the fluorine concentration), even if the titanium film was 5 nm to 15 nm thick, the peeling of the wiring has not occurred. On the other hand, also in the case of the comparison example, the peeling of the wiring neither occur. As described above, if the fluorine concentration increases, in other words, if the dielectric constant of the FSG film decreases, in the wiring structure constructed by forming mainly the aluminum system metal on the insulating film containing fluorine according to the present invention, it was verified that the wiring having the structure of forming the metallic film thereon via the titanium aluminum alloy film was effective to prevent the peeling of the wiring.

It is to be noted that, the insulating film 14 containing fluorine is not limited to the monolayer film as described in the above-mentioned exemplary embodiment. As described in the description of the conventional technology, it is also possible to construct as a lamination film of an insulating film containing fluoride and an insulating film without containing fluoride. In such a construction, when forming its insulating film 14 containing fluorine according to the above-mentioned method of manufacturing the semiconductor device, it may be implemented by forming an FSG film to a thickness of 700 nm, for example, by a high density plasma, then forming a P—$SiO_2$ film, for example, to a thickness of 1.20 $\mu$m, then flattening the surface of the insulating film containing fluorine by the CMP.

Further, as the above-mentioned insulating film 14 containing fluorine, other than the FSG film, for example, a fluorocarbon system insulating film may be used. For example, as the fluorocarbon system insulating film, material (for example, parylen) expressed by a chemical formula of $[CF_2—(C_6H_4)—CF_2]_n$, material (for example, polytetrafluoroethylene) expressed by a chemical formula of $[—CF_2—CF_2—]_n$, material (for example, poly(arylene-ether)) expressed by a chemical formula of $[—ORO—(C_6H_4)_2—]_n$ and the like may be used as well.

Still further, in the embodiment described above, although the two-layered wiring construction was indicated, even in a multi-layered wiring construction, if its wiring to be formed on the insulating film containing fluorine has a lamination structure of a titanium (Ti) film of an approximately 5 nm to 20 nm thickness and a metallic film 17*b* including aluminum or an aluminum alloy, the same may be used.

As described hereinabove, according to the semiconductor device of the present invention, because the titanium aluminum alloy film was formed on the insulating film containing fluorine, and the metallic film including aluminum or the aluminum alloy was formed on the titanium aluminum alloy film, the reaction between the free fluorine from the insulating film containing fluorine and titanium can be suppressed, and thereby ensuring the adhesion between the insulating film containing fluorine and the metallic film to be maintained. Thereby, it is enabled to use the insulating film containing fluorine which is the low dielectric film as the interlayer insulating film, and because of its adhesion with the metallic film serving as the wiring being secured, it provides for a highly reliable wiring that does not peel off from the insulating film containing fluorine.

Further, according to the method of manufacturing the semiconductor device of the present invention, because of the provision of the step of forming the titanium aluminum alloy film by reacting the titanium film and the part of aluminum in the metallic film, it is enabled to suppress the reaction between the free fluorine from the insulating film containing fluorine and titanium by the titanium aluminum alloy film thus produced. In other words, even if a long time heat treatment such as the sinter heat treatment or the like is performed, because titanium is consumed in the titanium aluminum alloying before the reaction of the free fluorine from the insulating film containing fluorine with titanium, the production of the titanium fluoride (TiF) which causes to drop the adhesion between the wiring and the insulating film containing fluorine can be suppressed. Thereby, it becomes possible to form a highly reliable wiring, which does not peel off, on the insulating film containing fluorine. Further, without increasing the number of processes in comparison with the conventional technology, it becomes possible to form a highly reliable wiring on the insulating film containing fluorine.

What is claimed is:

1. A method of manufacturing a semiconductor device comprising:

a step of forming an insulating film containing fluorine on a substrate;

a step of forming a titanium film directly on said insulating film containing fluorine;

a step of forming a metallic film comprising aluminum or an aluminum alloy on said titanium film; and a step of forming a titanium aluminum alloy film by causing to react said titanium film and a part of aluminum of said metallic film, said step being subsequent to the step of forming said metallic film inclusive thereof, and involving heating of said titanium film and said metallic film.

2. The method of manufacturing the semiconductor device according to claim 1, wherein said titanium aluminum alloy film is formed by:

a step of forming a titanium film on said insulating film containing fluorine;

a step of forming a metallic film comprising aluminum or an aluminum alloy on said titanium film; and reacting titanium of said titanium film and aluminum of said metallic film, when forming said metallic film by sputtering.

* * * * *